United States Patent
Ryu

(10) Patent No.: US 8,085,616 B2
(45) Date of Patent: Dec. 27, 2011

(54) BLOCK DECODER OF A FLASH MEMORY DEVICE

(75) Inventor: Je Il Ryu, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 874 days.

(21) Appl. No.: 12/134,146

(22) Filed: Jun. 5, 2008

(65) Prior Publication Data

US 2009/0043949 A1  Feb. 12, 2009

(30) Foreign Application Priority Data

Aug. 6, 2007  (KR) .................. 10-2007-0078541

(51) Int. Cl.
*G11C 8/00* (2006.01)
(52) U.S. Cl. .......... 365/230.06; 365/230.03; 365/185.11
(58) Field of Classification Search ............. 365/230.06, 365/230.03, 185.11
See application file for complete search history.

(56) References Cited

U.S. PATENT DOCUMENTS

2006/0010363 A1 * 1/2006 Marelli et al. ................ 714/758

FOREIGN PATENT DOCUMENTS

KR  1020020038862 A  5/2002
KR  1020020039950 A  5/2002

* cited by examiner

*Primary Examiner* — Jason Lappas
(74) *Attorney, Agent, or Firm* — Kilpatrick Townsend & Stockton LLP

(57) ABSTRACT

A block decoder increases the integration level of a flash memory device by reducing the number of control signals. Address signals are substituted with existing high voltage switch signals. The block decoder of a flash memory device includes a primary decoding unit and a secondary decoding unit. The primary decoding unit outputs a decoding signal in response to first and second address coding signals of a high voltage and first to third control signals. The secondary decoding unit outputs a control signal to control the potential of a block word line in response to the decoding signal and first and second pre-decoded signals.

12 Claims, 3 Drawing Sheets

BLOCK DECODER OF A FLASH MEMORY DEVICE

CROSS-REFERENCE TO RELATED APPLICATIONS

The present application claims priority to Korean patent application number 10-2007-0078541, filed on Aug. 6, 2007, which is incorporated by reference in its entirety.

BACKGROUND OF THE INVENTION

The present invention relates to a block decoder of a flash memory device and, more particularly, to a block decoder of a flash memory device, which can increase the integration level of a flash memory device by reducing the number of control signals.

There has been an increasing demand for semiconductor memory devices which can be electrically programmed and erased and do not need a refresh function of rewriting data at specific intervals. In order to develop large-capacity memory devices capable of storing a large amount of data, research has been done on the high integration of memory devices, particularly flash memory.

Flash memory is generally categorized as NAND flash memory and NOR flash memory. NOR flash memory has a structure in which memory cells are independently connected to bit lines and word lines and therefore exhibits excellent random access time characteristics. NAND flash memory has a structure in which memory cells are connected in series, requiring only one contact per cell string, and therefore exhibits high integration characteristics. Accordingly, the NAND structure is generally used in high-integrated flash memory.

In general, a flash memory device requires a block decoder for selecting a memory cell array on a per block basis to perform program, read and erase operations of a memory cell.

FIG. 1 is a circuit diagram showing a block decoder of a conventional flash memory device.

Referring to FIG. 1, a NAND gate ND1 logically combines address signals XA, XB, XC and XD. A NAND gate ND2 logically combines an output signal of the NAND gate ND1 and a program precharge signal PGMPREb. When at least one of the address signals XA, XB, XC and XD is input at a low level, the NAND gate ND1 outputs a high-level signal. When at least one of the output signals of the NAND gate ND1 and the program precharge signal PGMPREb is input at a low level, the NAND gate ND2 outputs a high-level signal.

A NAND gate ND3 logically combines an output signal of the NAND gate ND2 and a block enable signal EN. When the block enable signal EN is applied at a low level, the NAND gate ND3 outputs a high-level signal to turn on a transistor N2. Thus, a node Q1 is reset.

A transistor N1 is turned in response to a precharge signal PRE such that the output signal of the NAND gate ND2 is applied to the node Q1. The potential of the node Q1 functions as a block select signal BLKWL. Transistors N3 and N4 are turned on in response to first and second control signals GA and GB at a pumping voltage (Vpp) level, respectively, such that the pumping voltage Vpp is applied to the node Q1. Thus, a block switch 20 operates in response to the potential of the node Qt, that is, the block select signal BLKWL. Accordingly, global word lines GWL<31;0> and word lines of a memory cell array 30 are connected.

FIG. 2 shows line arrangements of signals used in the block decoder circuit of FIG. 1.

Referring to FIG. 2, a plurality of metal lines for inputting signals to control a block decoder is arranged beside a plurality of memory blocks (for example, 2048 metal lines are provided). Of the plurality of metal lines, the metal lines for inputting address signals XA<7:0>, XB<7:0>, XC<7:0> and XD<3:0> include 28 lines for inputting coding signals to select a memory block. When the metal line has a line width of 0.5 μm and a distance between the lines is 0.5 μm, a total amount of space occupied by the metal lines is 28 μm.

BRIEF SUMMARY OF THE INVENTION

The present invention is directed towards a block decoder of a flash memory device, which can reduce a chip size by substituting address signals, which are used in a block decoder of a flash memory device, with existing high voltage switch signals.

A block decoder of a flash memory device according to an aspect of the present invention includes a primary decoding unit and a secondary decoding unit. The primary decoding unit outputs a decoding signal in response to first and second address coding signals of a high voltage and first to third control signals. The secondary decoding unit outputs a control signal to control the potential of a block word line in response to the decoding signal and first and second predecoded signals.

The block decoder further includes a precharge circuit for precharging the block word line in response to the first and second address coding signals, and an enable unit for discharging the block word line in response to the control signal.

The primary decoding unit includes a signal generator for generating a first output signal in response to the first and second address coding signals and the first to third control signals, and a latch unit for temporarily storing the first output signal and outputting the first output signal as the decoding signal.

The signal generator includes first to fourth NMOS transistors connected in series between a power source voltage and a ground power source and respectively being turned on or off in response to the first control signal, the first address coding signal, the second address coding signal, and the second control signal. The signal generator also includes a fifth NMOS transistor connected between a node between the third NMOS transistor and the fourth NMOS transistor, and the latch unit. The fifth NMOS transistor is turned on in response to the third control signal.

The latch unit includes a latch having two inverters connected in parallel in a reverse direction, and an inverter connected to an output terminal of the latch.

The secondary decoding unit includes a first NAND gate for logically combining the decoding signal and the pre-decoded first and second address signals and outputting a logical combination result, a second NAND gate for logically combining an output signal of the first NAND gate and a program precharge signal and outputting a logical combination result as the control signal, and a NMOS transistor for transmitting the control signal to the block word line in response to a precharge signal that is at a high level during an erase operation.

The enable unit includes a NAND gate for logically combining the block enable signal and the control signal and outputting a logical combination result as a discharge signal, and a NMOS transistor connected between the block word line and a ground power source and adapted to apply the ground power source to the block word line in response to the discharge signal, thereby discharging the block word line.

The precharge circuit includes a switching circuit connected between the block word line and a pumping voltage. The switching circuit is turned on or off in response to the first and second address coding signals. The switching circuit transfers the pumping voltage to the block word line when turned on. The precharge circuit also includes a clipping circuit for clipping a voltage of the block word line to a set voltage.

The second and third NMOS transistors include high voltage transistors. The second and third NMOS transistors are turned in response to the first address coding signal and the second address coding signal, respectively.

DESCRIPTION OF SPECIFIC EMBODIMENT

A specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the present invention. The present invention is defined by the scope of the claims.

Figure 1:
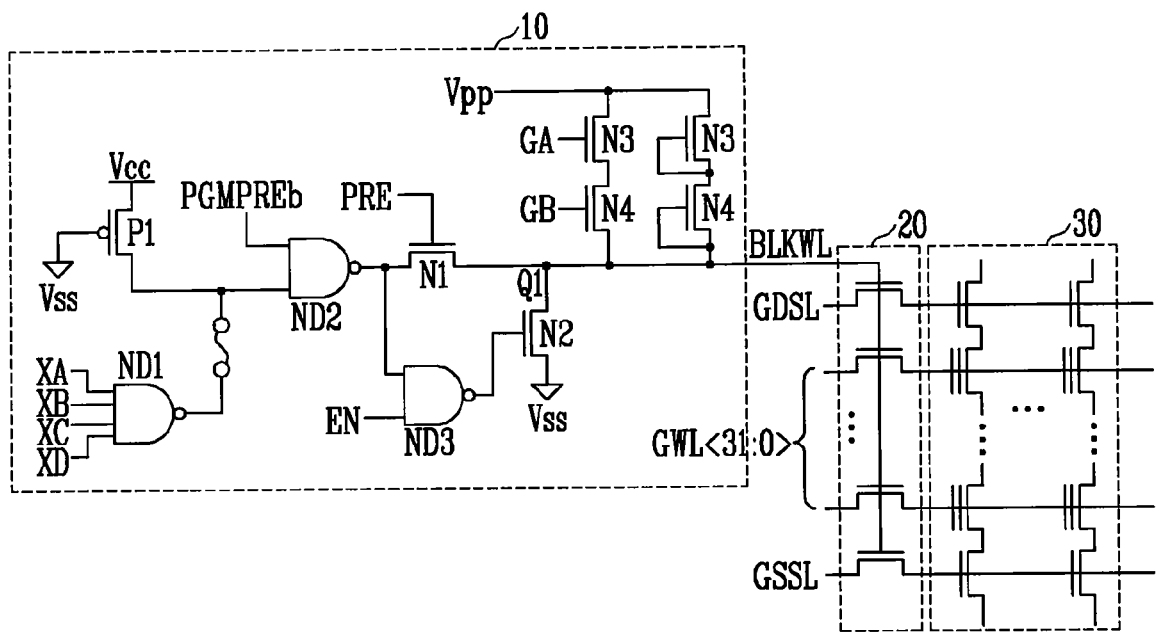
FIG. 1 is a circuit diagram showing a block decoder of a conventional flash memory device.
Figure 2:
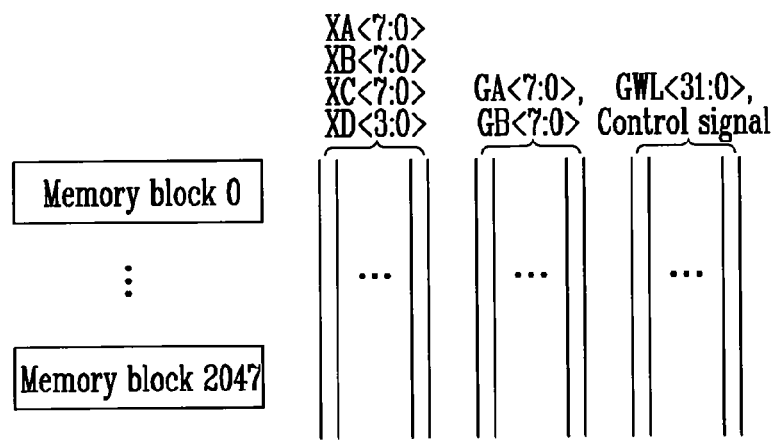
FIG. 2 shows line arrangements of signals used in the block decoder circuit of FIG. 1.
Figure 3:
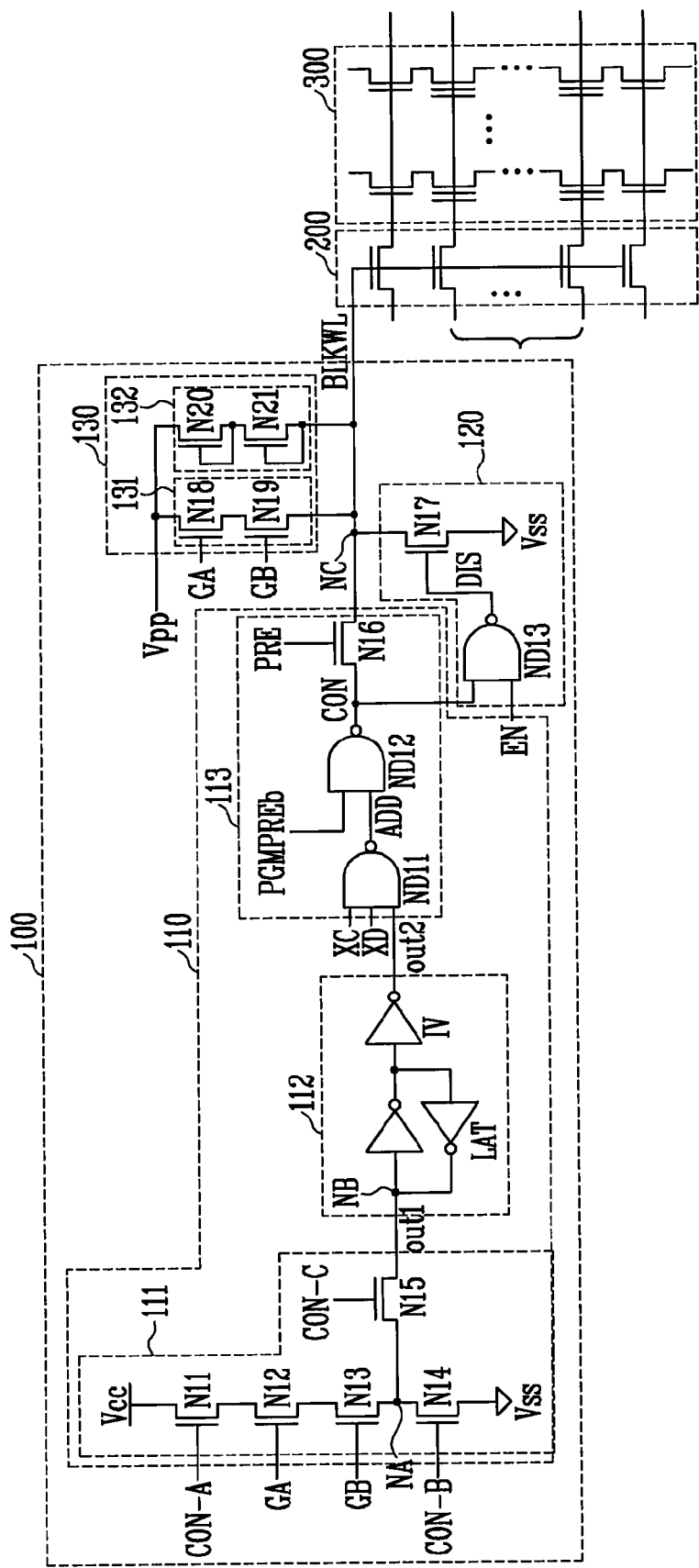
FIG. 3 is a circuit diagram showing a block decoder of a flash memory device in accordance with an embodiment of the present invention.

FIG. 3 is a circuit diagram showing a block decoder of a flash memory device in accordance with an embodiment of the present invention.

Referring to FIG. 3, a block decoder 100 includes a controller 110 for decoding address signals and outputting decoding results, an enable unit 120, and a precharge circuit 130.

The controller 110 includes a signal generator 111 for a primary decoding operation, a latch unit 112, and a signal controller 113 for a secondary decoding operation. The signal generator 111 generates a decoding signal outs in response to first to third control signals CON-A, CON-B, CON-C and first and second address coding signals GA, GB. The latch unit 112 temporarily stores the decoding signal outs and outputs an output signal out2. The signal controller 113 logically combines the output signal out2 of the latch unit 112, pre-decoded address signals XC, XD, and a program precharge signal PGMPREb, and outputs a logical combination result.

The signal generator 111 includes NMOS transistors N11 to N14 connected in series between a power source voltage Vcc and a ground power source Vss, and a NMOS transistor N15 connected between a node NA and the latch unit 112. The NMOS transistors N11 to N14 are turned on or off in response to the first control signal CON-A, the first high-voltage control signal GA, the second high-voltage control signal GB, and the second control signal CON-B, respectively, to thereby apply the power source voltage Vcc or the ground power source Vss to the node NA. The first high-voltage control signal GA and the second high-voltage control signal GB have the same addresses as those of the pre-decoded address signals XA and XB, but have a high voltage level. The second control signal CON-B is used to set an initial level of the node NA to a low level.

The NMOS transistor N15 outputs the potential of the node NA as the decoding signal out1 in response to the third control signal CON-C. The NMOS transistors N12 and N13 can be high voltage transistors so that they operate in response to the first high-voltage control signal GA and the second high-voltage control signal GB, that is, a high voltage signal.

The latch unit 112 includes a latch LAT and an inverter IV. The latch LAT includes two inverters connected in parallel in a reverse direction. The inverter IV is connected to an output terminal of the latch LAT. The latch LAT temporarily stores the decoding signal out1, and inverts and outputs the decoding signal out1. The inverter IV inverts the output signal of the latch LAT and outputs the inverted result as the output signal out2.

The signal controller 113 includes a first NAND gate ND11, a second NAND gate ND12, and a NMOS transistor N16. The first NAND gate ND11 logically combines the output signal out2 and the address signals XC and XD, and outputs an output signal ADD. The second NAND gate ND12 logically combines the output signal ADD and the program precharge signal PGMPREb, and outputs a control signal CON. The NMOS transistor N16 is turned on in response to a precharge signal PRE, and outputs the control signal CON to a node NC. The precharge signal PRE maintains a high level during an erase operation, but maintains a low level during program and read operations.

The enable unit 120 includes a third NAND gate ND13 and a NMOS transistor N17. The third NAND gate ND13 outputs a discharge signal DIS in response to the control signal CON and a block enable signal EN. The NMOS transistor N17 is connected between the node NC and a ground power source Vss and discharges the node NC in response to the discharge signal DIS.

The precharge circuit 130 includes a switching circuit 131 and a clipping circuit 132. The switching circuit 131 includes NMOS transistors N18 and N19. The drain of the NMOS transistor N18 is connected to a pumping voltage Vpp and the source of the NMOS transistor N18 is connected to the drain of the NMOS transistor N19. The source of the NMOS transistor N19 is connected to a block word line BLKWL. First and second address coding signals GA and GB are input to the gates of the NMOS transistors N18 and N19, respectively. The NMOS transistors N18 and N19 are turned on or off in response to the first and second address coding signals GA and GB, respectively. When the NMOS transistors N18 and N19 are turned on, the block word line BKWL is precharged to the pumping voltage (Vpp) level.

The clipping circuit 132 includes NMOS transistors N20 and N21. The NMOS transistor N20 is diode-connected to the drain of the NMOS transistor N21 in a reverse direction. The NMOS transistor N21 is diode-connected to the block word line BLKWL in a reverse direction. The drain of the NMOS transistor N20 is connected to the pumping voltage Vpp. When a voltage level of the block word line BLKWL rises above a set voltage level, the NMOS transistors N20 and N21 clip the voltage level to maintain the voltage level of the block word line BLKWL at the set voltage level.

Reference numeral 200 denotes a block switch unit and reference numeral 300 denotes a memory cell array block.

Figure 4:
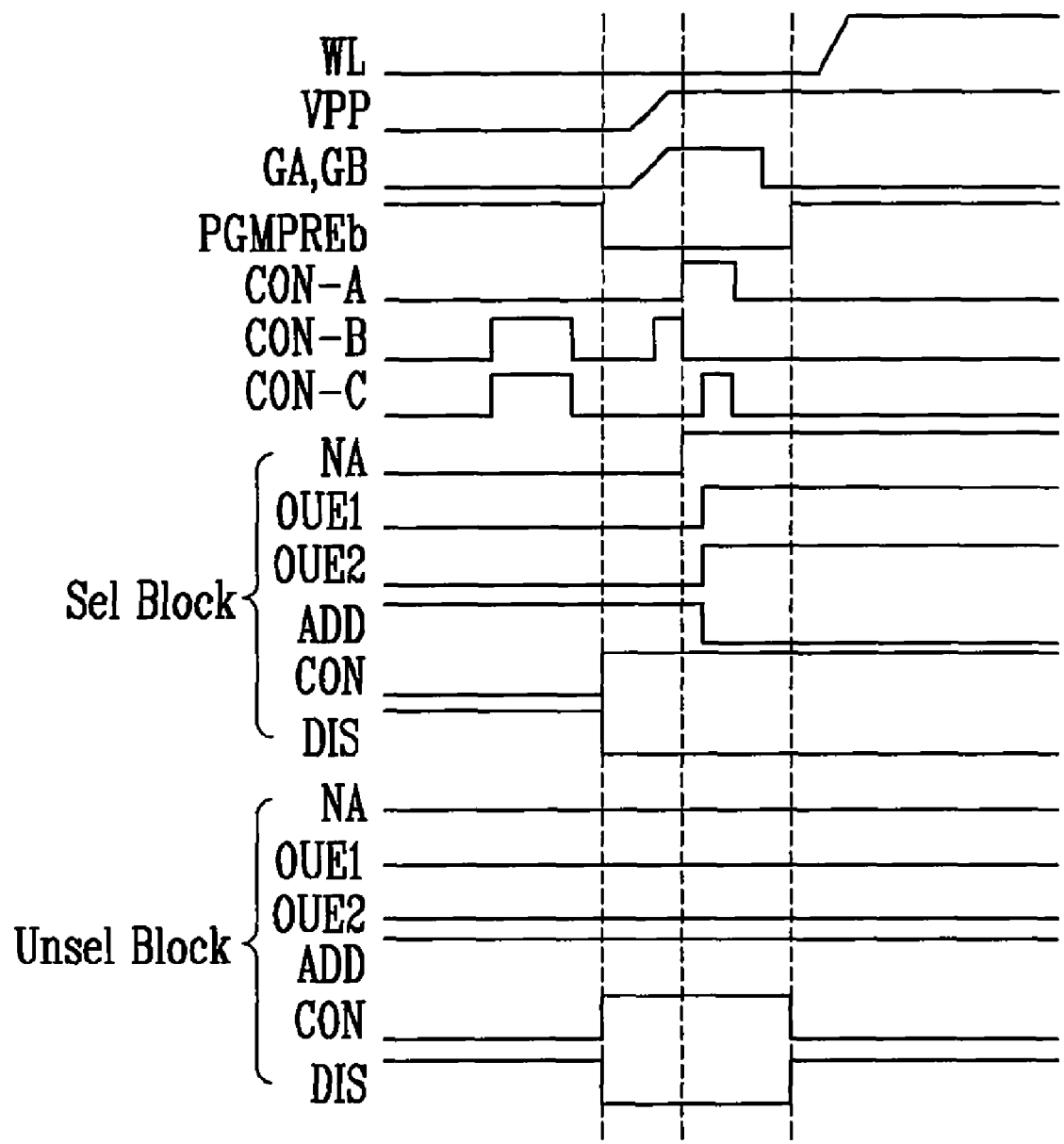
FIG. 4 shows waveforms of signals for illustrating an operation of the block decoder circuit shown in FIG. 3.

FIG. 4 shows waveforms of signals for illustrating an operation of the block decoder circuit 100 shown in FIG. 3.

A method of driving the block decoder unit 100 during a program or read operation in accordance with an embodiment of the present invention is described below with reference to FIGS. 3 and 4.

The second and third control signals CON-B and CON-C are applied at a high level for a specific time period, such that the NMOS transistors N14 and N15 are turned on. Thus, the node NB is discharged to a low level and is reset.

The program precharge signal PGMPREb of a high level is applied at a low level for a specific time period, such that the NAND gate ND12 of the signal controller 113 outputs the control signal CON at a high level irrespective of the level of the output signal ADD. The NAND gate ND13 of the enable unit 120 outputs the discharge signal DIS at a low level in response to the control signal CON of a high level and the block enable signal EN of a high level. The NMOS transistor N17 cuts off the ground power source Vss, applied to the node NC, in response to the discharge signal DIS of a low level.

In order to select the memory cell array block 300, all of the pre-decoded address signals XA, XB, XC and XD are enabled at a high level. In an embodiment of the present invention, only the pre-decoded address signals XC and XD are used. Accordingly, metal lines for applying the pre-decoded address signals XA and XB are not required in the present invention. Instead of the pre-decoded address signals XA and XB that were used in the prior art, the first and second address coding signals GA and GB that are used in the existing precharge circuit 130 are used in the signal generator 111. The first and second address coding signals GA and GB are signals that are enabled with a specific delay time when the pre-decoded address signals XA and XB are enabled. Specifically, the first and second address coding signals GA and GB are high voltage signals generated using the pre-decoded address signals XA and XB.

When the first and second address coding signals GA and GB shift to a high level, the precharge circuit 130 precharges the block word line BLKWL to the pumping voltage (Vpp) level.

While the first and second address coding signals GA and GB are pumped to a specific potential, the second control signal CON-B is applied at a high level for a specific time period, thereby discharging the node NA to a low level. Thereafter, when the first and second address coding signals GA and GB are pumped to a specific potential, the first control signal CON-A is applied at a high level, thereby charging the node NA to the power source voltage (Vcc) level. The third control signal CON-C is applied at a high level, such that the potential of the node NA is output as the decoding signal out1. The latch unit 112 temporarily stores the decoding signal out1 at a high level and outputs the output signal out2 at a high level.

The NAND gate ND11 of the signal controller 113 logically combines the pre-decoded address signals XC and XD at a high level and the output signal out2 at a high level, and outputs the output signal ADD at a low level. The NAND gate ND12 logically combines the output signal ADD at a low level and the program precharge signal PGMPREb, which shifts from a low level to a high level, and outputs the control signal CON at a high level.

Since the control signal CON is maintained at a high level, the enable unit 130 maintains the discharge signal DIS, output from the NAND gate ND13, at a low level. Accordingly, the block word line BLKWL maintains the pumping voltage (Vpp) level to enable the block select switch unit 200 which enables word lines of the memory cell array block 300.

According to an embodiment of the present invention, some address signals, which have been used in a block decoder of a flash memory device, are substituted with existing high voltage switch signals. Accordingly, the chip size of the flash memory device can be reduced.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A block decoder of a flash memory device, the block decoder comprising:
   a primary decoding unit configured to output a decoding signal in response to first and second address coding signals and first, second and third control signals, wherein the first and second address coding signals are high voltage signals; and
   a secondary decoding unit configured to output a control signal to control the potential of a block word line in response to the decoding signal and first and second pre-decoded signals.

2. The block decoder of claim 1, further comprising:
   a precharge circuit configured to precharge the block word line in response to the first and second address coding signals; and
   an enable unit configured to discharge the block word line in response to the control signal.

3. The block decoder of claim 1, wherein the primary decoding unit comprises:
   a signal generator configured to generate a first output signal in response to the first and second address coding signals and the first, second and third control signals; and
   a latch unit configured to temporarily store the first output signal and to output the first output signal as the decoding signal.

4. The block decoder of claim 3, wherein the signal generator comprises:
   first, second, third and fourth NMOS transistors connected in series between a power source voltage and a ground power source, wherein the first, second, third and fourth NMOS transistors are turned on or off in response to the first control signal, the first address coding signal, the second address coding signal, and the second control signal, respectively; and
   a fifth NMOS transistor connected between a node between the third NMOS transistor and the fourth NMOS transistor, and the latch unit, wherein the fifth NMOS transistor is turned on in response to the third control signal.

5. The block decoder of claim 3, wherein the latch unit comprises:
   a latch comprising two inverters connected in parallel in a reverse direction; and
   an inverter connected to an output terminal of the latch.

6. The block decoder of claim 1, wherein the secondary decoding unit comprises:
   a first NAND gate configured to logically combine the decoding signal and the pre-decoded first and second address signals, and to output a logical combination result;
   a second NAND gate configured to logically combine an output signal of the first NAND gate and a program precharge signal, and to output a logical combination result as the control signal; and
   a NMOS transistor configured to transmit the control signal to the block word line in response to a precharge signal that is at a high level during an erase operation.

7. The block decoder of claim 2, wherein the enable unit comprises:
   a NAND gate configured to logically combine the block enable signal and the control signal, and to output a logical combination result as a discharge signal; and
   a NMOS transistor connected between the block word line and a ground power source, wherein the NMOS transistor is configured to apply the ground power source to the block word line in response to the discharge signal such that the block word line is discharged.

8. The block decoder of claim 2, wherein the precharge circuit comprises:
   a switching circuit connected between the block word line and a pumping voltage, wherein the switching circuit is configured to turn on or off in response to the first and second address coding signals, the switching circuit transferring the pumping voltage to the block word line when the switching circuit is turned on; and
   a clipping circuit configured to clip a voltage of the block word line to a set voltage.

9. The block decoder of claim 4, wherein the second and third NMOS transistors comprise high voltage transistors, the second and third NMOS transistors being turned in response to the first address coding signal and the second address coding signal, respectively.

10. A block decoder of a flash memory device, the block decoder comprising:
    a primary decoding unit configured to output a decoding signal based on first and second address coding signals, wherein the first and second address coding signals comprise first and second pre-decoded high voltage signals; and
    a secondary decoding unit configured to output a control signal to control the potential of a block word line based on the decoding signal and first and second pre-decoded signals.

11. The block decoder of claim 10, wherein when the first and second pre-decoded signals are enabled, the first and second address coding signals are enabled at a high voltage level after a delay time has elapsed.

12. The block decoder of claim 10, further comprising a precharge unit configured to precharge the potential of the block word line to a high level based on the first and second address coding signals.

* * * * *